United States Patent [19]

Fusegawa et al.

[11] Patent Number: 5,262,338
[45] Date of Patent: Nov. 16, 1993

[54] METHOD FOR FABRICATION OF SEMICONDUCTOR DEVICE

[75] Inventors: Izumi Fusegawa; Hirotoshi Yamagishi; Nobuyoshi Fujimaki; Yukio Karasawa, all of Gunma, Japan

[73] Assignee: Shin-Etsu Handotai Co., Ltd., Tokyo, Japan

[21] Appl. No.: 850,506

[22] Filed: Mar. 13, 1992

[30] Foreign Application Priority Data

Mar. 15, 1991 [JP] Japan ................. 3-076875

[51] Int. Cl.$^5$ ............................. H01L 21/265
[52] U.S. Cl. ......................... 437/40; 437/10; 437/114
[58] Field of Search ............ 437/10, 11, 114, 115, 437/12, 13, 45, 40; 257/339, 355, 356, 357, 409

[56] References Cited

U.S. PATENT DOCUMENTS

| | | | |
|---|---|---|---|
| 4,371,403 | 2/1983 | Ikubo et al. | 437/24 |
| 5,061,642 | 10/1991 | Fujioka | 437/11 |
| 5,110,404 | 5/1992 | Fusegawa et al. | 437/10 |

Primary Examiner—Brian E. Hearn
Assistant Examiner—Tuan Nguyen
Attorney, Agent, or Firm—Townsend, Snider & Banta

[57] ABSTRACT

A semiconductor device of the MOS construction such that a gate oxide film of the device has a gate area in the range of from 5 to 15 mm$^2$ and a thickness in the range of from 15 to 40 nm and the oxide film dielectric breakdown voltage is not less than 8 MV/cm when a gate current caused to flow in response to application of a direct-current voltage between a phosphorus-doped polysilicon electrode formed on the oxide film and a silicon single crystal substrate increases past 1 μA/mm$^2$ as current density is obtained by using a silicon wafer substrate having an oxygen concentration of not more than $1 \times 10^{18}$ atoms/cm$^3$.

3 Claims, 1 Drawing Sheet

METHOD FOR FABRICATION OF SEMICONDUCTOR DEVICE

BACKGROUND OF THE INVENTION

1. Field of the Invention

This invention relates to a method for the fabrication of a semiconductor device. More particularly, this invention relates to a method for the fabrication of a semiconductor device of the MOS (Metal Oxide Semiconductor) construction possessed of a gate oxide film excellent in dielectric strength.

2. Description of the Prior Art

The gate oxide film in the semiconductor device of the MOS construction is desired to have the smallest possible thickness and manifest a high dielectric strength uniformly. Various conditions have been proposed for the formation of a film oxide capable of producing a high dielectric strength and have accomplished the desire to some extent.

From the point of view of a silicon wafer substrate, however, since the question as to what kind of silicon substrate ought to be used to obtain successful formation of an ideal gate oxide film remains in the greater part yet to be elucidated, no noteworthy measure has existed to date except for the practice of preparing polished wafers of a prescribed thickness from an actually pulled semiconductor single crystal bar, producing MOS construction devices from the polished wafers, testing the devices for oxide film dielectric strength, selecting those having a dielectric breakdown voltage above a prescribed minimum as conforming samples, and putting the conforming products to use.

SUMMARY OF THE INVENTION

This invention has been produced for the purpose of overcoming the drawback of prior art described above. An object of this invention has been to find conditions of a silicon wafer substrate which allow production of a semiconductor device of the MOS construction possessed of a gate oxide film excellent in dielectric strength.

The method of this invention for the fabrication of a semiconductor device of the MOS construction, a gate oxide film of which has a gate area in the range of from 5 to 15 mm$^2$ and a thickness in the range of from 15 to 40 nm and shows the oxide film dielectric breakdown voltage of not less than 8 MV/cm when a gate current caused to flow in response to application of a direct-current voltage between a phosphorus-doped polysilicon electrode formed on the oxide film and a silicon single crystal substrate increases past 1 $\mu$A/cm$^2$ as current density, is characterized by using a silicon wafer substrate having an oxygen concentration of not more than $1 \times 10^{18}$ atoms/cm$^3$.

DETAILED DESCRIPTION OF THE PREFERRED EMBODIMENT

Figure 1:
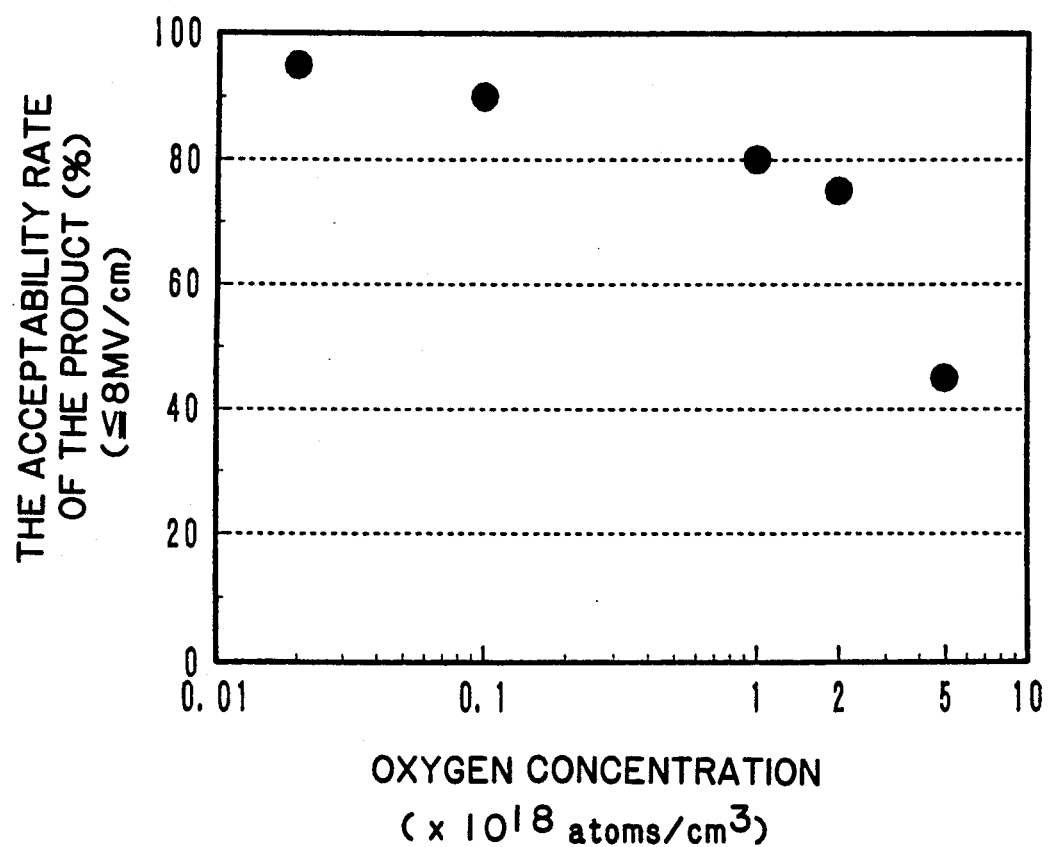
FIG. 1 is a graph showing the relation between the concentration of oxygen contained in a silicon wafer and the ratio of conforming oxide films of acceptable dielectric breakdown voltage.

When a plurality of MOS construction devices possessed of a gate oxide film having a gate area in the range of from 5 to 15 mm$^2$ and a thickness in the range of from 15 to 40 nm are substantially uniformly produced by forming such gate oxide films on the surface of a silicon wafer substrate having an oxygen concentration of not more than $1 \times 10^{18}$ atoms/cm$^2$, it is in not less than 80% of all the produced devices that the oxide film dielectric breakdown voltage which exists when a gate current caused to flow in response to application of a direct-current voltage between a phosphorus-doped polysilicon electrode formed on the oxide film and a silicon single crystal substrate increases past 1 $\mu$A/mm$^2$ as current density is not less than 8 MV/cm.

The method of this invention ideally fits not only the fabrication of MOS type semiconductor devices which by themselves perform various electronic operations useful for stated purposes but also the production of semiconductor devices intended as samples to be used in testing MOS type semiconductor devices originating in a pulled silicon single crystal bar or in wafers cut out of the single crystal bar for the purpose of preliminary evaluation of the dielectric strength of the gate oxide film. In this case, this invention is significant as a method for the production of testing devices. If the gate area deviates from the range of from 5 to 15 mm$^2$ or the thickness of the gate oxide film deviates from the range of from 15 to 40 nm, the disadvantage ensues that the produced testing devices register accurate values of oxide film dielectric breakdown voltage only with difficulty.

<EXAMPLE>

Now, this invention will be described more specifically below with reference to a working example.

A plurality of semiconductor silicon single crystal bars 130 mm un diameter were pulled by the CZ method (Czochralski method) and the FZ method (Float Zone method). In the CZ method, silicon placed in a quartz crucible was doped with boron and adjusted to an electric resistance of 10 ohm.cm. A plurality of bars were grown by fixing the speed of pulling at 1.2 mm/min. and the varying the oxygen concentration in the range of from 0 to $5 \times 10^{18}$, atoms/cm$^3$. The single crystal bars produced were invariably pulled in the orientation of <100>. It is well known that generally in the fabrication of a semiconductor silicon single crystal bar by the CZ method, an addition to the speed of pulling results in the oxide film's ability to dielectric breakdown voltage. Thus, the growth of crystal was effected at the fixed speed of pulling mentioned above. Wafers of a prescribed thickness were cut out of the single crystal bar with a diamond saw and their surfaces were subjected to chemical polishing to afford polished wafers.

The polished wafers thus obtained was, to be tested for the relation between the oxygen concentration and the oxide film dielectric breakdown voltage, were subjected to a heat treatment adapted for determination of oxide film dielectric breakdown voltage. The wafers were cleaned with RCA mixture and subjected to 100 minutes' gate oxidation at 900° C. to form an oxide film 25 nm in thickness thereon. Electrode patterns 8 mm$^2$ in area were formed on the oxide films of the wafers by depositing polysilicon on the oxide films and diffusing phosphorus as a dopant in the superposed polysilicon layers. To test the oxide films for dielectric breakdown voltage, a voltage was applied between the electrodes and silicon substrates so as to give rise to an electric field of several MV/cm. The dielectric breakdown voltage of a sample was defined as a voltage at which the electric current passed as described above through the sample increases past 1 μA/mm². The samples found to have oxide film dielectric breakdown voltages of not less than 8 MV/cm were rated as acceptable products. The acceptability rate of the product (%) was calculated by dividing the number of acceptable products by the total number of products (chips) from a given polished wafer width.

FIG. 1 shows the acceptability rate of the product with respect to oxide film dielectric breakdown voltage (%) as the function of the oxygen concentration. It is clearly noted from the diagram that the two factors were correlated in such a manner that the oxide film dielectric breakdown voltage degraded in inverse proportion as the oxygen concentration increased. FIG. 1 indicates that the ratio of conforming products was 80% when the oxygen concentrations in the silicon wafer substrates were not higher than $1 \times 10^{18}$ atoms/cm³.

In accordance with this invention, MOS construction semiconductor devices possessed of a gate oxide film excellent in dielectric strength are produced in a high yield as clearly inferred from the description given above.

What is claimed is:

1. A method of producing a semiconductor device of the MOS construction comprising:

a step of forming a thermal oxygen film of 14 nm to 40 nm thickness on a principal surface of a single crystal silicon semiconductor wafer having an oxide concentration of no more than $1 \times 10^{18}$ atoms/cm³; and a step of forming a polysilicon electrode doped with phosphorus on said thermal oxide film, wherein the oxide film dielectric breakdown voltage at which the gate current density reaches to 1 μa/mm² is no lower than 8 MV/cm.

2. The method in accordance with claim 1, wherein said step of forming a thermal oxygen film further comprising placement of the principal plane in the orientation of <100>.

3. The method in accordance in claim 1, wherein said thermal oxygen film has an area in the range of 5 mm² to 15 mm².

* * * * *